June 3, 1969 E. SIRTL 3,447,977

METHOD OF PRODUCING SEMICONDUCTOR MEMBERS

Original Filed Aug. 9, 1963

United States Patent Office 3,447,977

Patented June 3, 1969

3,447,977

METHOD OF PRODUCING SEMICONDUCTOR MEMBERS

Erhard Sirtl, Munich, Germany, assignor to Siemens Aktiengesellschaft, Munich, Germany, a corporation of Germany Continuation of application Ser. No. 546,485, Apr. 28, 1966, which is a continuation of application Ser. No. 301,036, Aug. 9, 1963. This application Nov. 13, 1967, Ser. No. 682,673

Claims priority, application Germany, Aug. 23, 1962, S 81,056

Int. Cl. H01l 7/36

U.S. Cl. 148—174 3 Claims

ABSTRACT OF THE DISCLOSURE

Method of producing a semiconductor member by precipitating layers of a substance consisting of high-ohmic p-conductive silicon on a monocrystalline carrier of high-doped silicon includes placing a surface of the carrier in contact engagement with a supporting surface of a heated support consisting of the substance to be precipitated as well as impurity substances whereby the carrier is heated by heat transfer from the heated support, subjecting the supporting surface of the support to a flowing gas atmosphere containing at least one gaseous substance selected from the group consisting of halogens and halides free of hydrogen and hydrogen halide impurities, and heating the support to a temperature at which a transport reaction occurs for causing transfer from the support to the carrier surface of only the substance to be precipitated, by forming a gaseous compound of the atmosphere with only the substance to be precipitated and then decomposing the gaseous compound and precipitating the substance in monocrystalline form on the surface of the carrier, a second surface of the support facing away from the surface of the carrier being provided with a coating for preventing undesired precipitation on the second surface of the support.

This application is a continuation of application Ser. No. 546,485, filed Apr. 28, 1966, now abandoned, which is in turn a continuation of application Ser. No. 301,036, filed Aug. 9, 1963, and now abandoned.

My invention relates to the production of semiconductor members for diodes, transistors, semiconductor controlled rectifiers and other semiconductor devices, by precipitating monocrystalline semiconductor layers from a gaseous semiconductor compound onto a semiconductor substrate placed upon a heated support.

Such epitaxial precipitation methods serve to produce a semiconductor layer sequence of respectively different specific resistance and/or type of conductance. The methods require heating the support of the substrates, usually in form of plates, discs or wafers, to such a high temperature that the substrate surface facing away from the support assumes the reaction temperature required for thermal dissociation of a gaseous halogen compound of the semiconductor substance passing through the reaction vessel, thereby causing a monocrystalline growth of the precipitating semiconductor substance upon the free surfaces of the substrates.

It has been proposed that such epitaxial production methods be performed with the aid of a heater or support consisting of hyperpure semiconductor material in order to minimize contamination of the precipitating layers from the support. However, and as will be further explained hereinafter, the transfer of certain impurities, such as phosphorus, from the support into the substrate of the semiconductor member being produced, cannot always be prevented in this manner to the desired extent. It is, therefore, troublesome with the known method to obtain epitaxially grown products of particularly exacting electronic purity. Particularly, the production of extremely pure silicon in form of epitaxially grown layers has heretofore met with an appreciable technological and economical limitation as to the attainable degree of purity.

It is an object of my invention to devise an epitaxial production method, generally related to the above-mentioned kind, that readily affords the precipitation of epitaxial layers distinguished by improved purity, or that afford securing a desired degree of purity in a more reliable manner.

It is another object of my invention to devise an epitaxial production method suitable for producing hyperpure silicon layers on substrates of silicon not necessarily possessing the same high purity.

It is also an object of my invention to devise an epitaxial production method that affords the precipitation of semiconductor substance from the gaseous phase onto the particular surface area only at which the epitaxial layer is to be grown, while preventing a precipitation of semiconductor material at other localities within the reaction vessel such as upon the heater which applies the reaction temperature to the substrate that is to be epitaxially coated or upon other surface areas of the substrate.

Further objects of my invention relate to performing the novel method simultaneously with a controlled doping of the epitaxial layers being produced so as to obtain a desired sequence of conductance properties in the semiconductor member.

According to the invention the semiconductor body or substrate to be provided with an epitaxial layer is placed on top of the supporting structure which is to be heated during the precipitation process. That is, the surface, such as one of the planar sides of the plate or disc that is to receive the epitaxial precipitation, is placed face-to-face with the top surface of the heating support. Furthermore, the top surface of the support is subjected during the process to the effects of a gas atmosphere that contains pure halogen and/or halogenide but is free of hydrogen and hydrogen halide. While being exposed to such a gas atmosphere, the support is heated to the high temperature required to effect a transport reaction due to the temperature gradient which is set up between the support and the semiconductor body being heated. As a result of the transport reaction, semiconductor substance from the support consisting of the semiconductor substance to be precipitated at least at the supporting surface, is transferred to the substrate surface facing the support.

As mentioned, this process is performed to the exclusion of elemental and chemically bonded hydrogen. The precipitation of semiconductor substance onto the side of the semiconductor body facing the support is due in this method to a chemical transport reaction. The reaction space is the narrow gas space between the top surface of the support and the semiconductor substrate body; and the temperature transition required to produce a transport reaction is effected by heat transfer from the heated support to the preferably flat or plate-shaped semiconductor body, resting upon the support. In this manner, compact and particularly monocrystalline, layers are caused to grow upon the bottom side of the supported semiconductor body.

Transport of the semiconductor substance from the support to the bottom side of the semiconductor body takes place during the formation of the gaseous halide, particularly the subhalide of the semiconductor substance being transported.

The gas atmosphere acting upon the support consists either of pure halogen or of pure halide, and more particularly the halide of the semiconductor substance to be transported. However, the gas atmosphere may also simultaneously contain as a mixture halogen and the corresponding halide, particularly the halide of the semiconductor substance to be transported. If desired, the halogen and/or halide can be diluted by admixing an inert gas, for example argon, or by applying negative pressure thereto.

The method is carried out according to the invention preferably with a continuous flow of the reaction gas, and it is preferable to maintain the walls of the reaction vessel at a temperature lower than that of the semiconductor body. The method can, however, also be performed in an enclosed reaction vessel containing a suitable quantity of gas.

To prevent the erosion of material from the side of the semiconductor body facing away from the support, during the performance of the method, it is preferable to cover this side by a planar plate of inert material. For operating temperatures below 1000° C., the cover plate may consist of a quartz pane, for example, whereas for operation at higher temperature, it is preferable to employ a cover plate of silicon carbide, boron nitride or aluminum oxide (e.g., sapphire). With this type of protective covering, a slight erosion of material takes place only at the edge of the plate-shaped semiconductor body or substrate. In order to prevent even such residual effect, the semiconductor plates may be previously coated with a gastight oxide or carbide layer so that only the side facing the support is exposed. The cover for the free plate surface may also be formed, particularly if the semiconductor body consists of silicon, by reacting the semicondutcor surface with oxygen or steam, thus forming a gastight oxide layer consisting of the oxide of the semiconductor material. Also by reacting $CH_2Cl_2$ with the surface of a silicon body, a thin and gastight coating of silicon carbide is produced which provides suitable protection against erosion.

Research has shown that impurity elements which may be present in the semiconductor substances exhibit a marked difference in behavior, depending upon the transport-reaction system. Therefore, to a great extent the choice of the atmosphere which effects transport of the substance, determines whether a doping substance is quantitatively transferred from the support to the bottom side of the semiconductor body, or whether the doping substance is blended to a much lesser extent into the layer precipitated by the transport and thus is greatly depleted in the epitaxial layer.

Thus, when highly pure silicon layers are to be produced by a transport reaction, the presence of hydrogen or hydrogen halide is particularly disturbing because hydrogen promotes the transport and introduction of phosphorus into the growing layer. In accordance with my invention, however, when the process is performed in an atmosphere free of hydrogen and hydrogen halide and containing halogen and/or halide other than hydrogen halide as the essential component, for example when the process is performed with pure silicon tetrachloride ($SiCl_4$) or chlorine ($Cl_2$), then depletion of the phosphorus content occurs. That is, the silicon layer which is epitaxially grown by transport reaction upon the semiconductor body is considerably purer than the silicon of the supporting structure. Consequently, the method according to the invention provides a way of producing very high-ohmic p-type layers of epitaxy. The production of highly pure silicon in form of epitaxially grown layers has heretofore failed because the so-called donor "X" essentially consisting of phosphorus has always been found blended into the grown crystalline layer.

The transport of gallium arsenide (GaAs), in contrast, occurs for most impurity elements at a maintained dopant level when the process of the invention is performed in an atmosphere of halogen and/or halide which is free of hydrogen and hydrogen halide, for example when an atmosphere of iodine and/or iodide of the semiconductor substance is used. In this case, the impurity elements from the support are transferred virtually in quantitative ratio to the semiconductor substance.

The invention will be further described and explained with reference to embodiments of semiconductor members and processing devices illustrated by way of example on the accompanying drawings, and also with reference to examples of the process according to the invention mentioned hereinafter.

Figure 1:
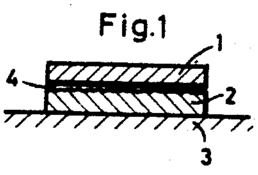
FIGS. 1, 2 and 3 show schematically and in vertical section respectively different assemblies of semiconductor bodies and supports during a production process according to the invention.

In FIG. 1 there is shown a monocrystalline semiconductor body or substrate 1 which is to be provided on its bottom side with an epitaxially grown layer of semiconductor material. The body 1 is placed upon a supporting structure such as a plate 2 consisting of the semiconductor substance to be transported and being in polycrystalline or monocrystalline form. The support 2 is placed on top of a heater 3 formed, for example, by a carbon slab coated with silicon carbide and heated by directly passing electric current lengthwise through the slab. The transport reaction takes place in the interspace 4 between the support 2 and the semiconductor body 1. With increasing temperautre the partial pressure of the subhalogenides which transport the semiconductor substance increases, and the quantity of transported semiconductor substance per unit time increases accordingly. The temperature of the support 2 and the partial pressure of the halogen or halide in the atmosphere intervening between the support 2 and the body 1 are regulated with respect to the period of time desired for the precipitation of an epitaxial layer of a given thickness.

Figure 2:
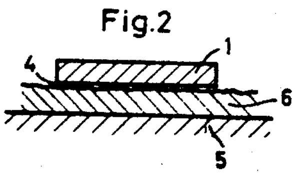

According to FIG. 2, the heater 5 may also consist of a carbon slab heated by directly passing current therethrough. This slab 5 is coated with a layer 6 of the semiconductor substance to be transported. Placed upon the top surface of this semicondutcor-coated heater is a semiconductor body 1 consisting, for example, of a monocrystalline plate. In the embodiments shown in FIG. 2, the heater simultaneously serves as the support by virtue of the semiconductor material coating at its effective top surface, and can be constructed of sufficient size to accommodate a number of crystal plates 1 simultaneously. As in the embodiment of FIG. 1, the assembly is located in a gas atmosphere containing pure halogen and/or halogen compound but being free of hydrogen in free or chemically bonded form.

Figure 3:
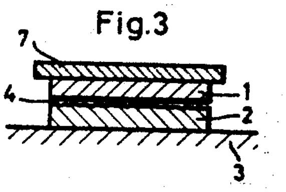

To prevent erosion of material from the semiconductor 1 during epitaxial deposition on its bottom side by the transport reaction, a cover plate 7 is placed on the top surface of the semiconductor body 1 in the embodiment shown in FIG. 3.

To secure an epitaxial growth of monocrystalline material on the semiconductor body 1, the bottom surface that is to receive this growth must be polished to accurate planar shape. It is advisable to also polish the planar top side of the semiconductor plate if this side is to remain substantially free of attack. In such a case the side of the cover plate 7 facing the semiconductor body is then likewise planar and no erosion corresponding to the main reaction occurring in the interspace 4 can then take place at this top surface of the semiconductor body. In many cases, however, a lapped top surface of the semiconductor body 1 is sufficient.

The supporting surface from which semiconductor material is to be removed by the transport reaction should be given a minimum roughness of about 3–5 $\mu$m. (roughness depth), so that on the one hand the reaction gas can sufficiently diffuse into the interspace 4 between support and semiconductor 1 and, on the other hand, an appreciable temperature transition develops through heat transfer from the support to the semiconductor body. As shown in FIG. 3, for example the supporting surface of the support structure 2 has an area substantially corresponding to the area of the body surface which is to receive the epitaxial growth.

The method according to the invention is also well suitable for the production of so-called "heterojunctions," i.e., junctions between zones of respectively different semiconductor materials.

By employing a support having a different conductance and/or type of conductance, i.e., n- or p-type, from that of the substrate semiconductor, the process permits the production of junctions between layers of different ohmic resistance (conductance) and/or different conductance types. In this manner, single or multiple p-n junctions can be produced by the epitaxial precipitation process.

Since, in such a process, the doping of the epitaxial layer growing upon the bottom side of the substrate is essentially determined by the dopant content of the support, a plurality of the arrangements illustrated in FIGS. 1 to 3 can be disposed in the same reaction vessel and the respectively different semiconductor bodies can be simultaneously provided with epitaxial layers of different doping depending upon the chosen doping of the respective supports. Within the scope of the present invention, the use of a transport medium having a composition of weak erosion effect throughout the entire reaction space rather than only in the reaction zone between support and semiconductor body, has the advantage that even when operating with flowing reaction gas, the precipitation of semiconductor material is limited to the semiconductor side facing the support, whereas precipitation upon the heater or support itself is prevented.

Figure 4:
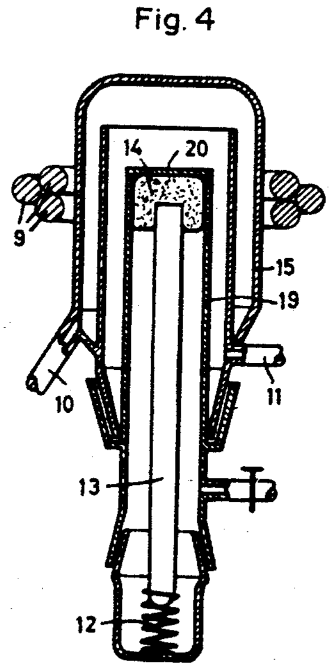
FIG. 4 shows schematically and in vertical section an apparatus for performing the process.

The processing equipment shown by way of example in FIG. 4 is particularly suitable for operation at temperatures up to 1000° C., and consequently for the processing of germanium, for example. The reaction vessel 15 consisting of quartz or similar vitreous material is provided with a gas inlet 10 and a gas outlet 11. A quartz tube 19 extends upwardly into the vessel from below. A shaped carbon body 14 is mounted on top of a rod 13 of sintered corundum and is pressed by a helical compression spring 12 upwardly against the inner face of the closed top 20 of the quartz tube 19. A high-frequency induction coil 9 surrounds the reaction vessel 19 at the level of the carbon body 14 and serves to heat this body when the coil is energized.

For performing the process, one or more assemblies according to FIG. 3 are placed on the outer face of the top 20 of the tube 19. The processing atmosphere, containing halogen and/or suitable halide but free of hydrogen and hydrogen halide, is introduced through the inlet 10, and the residual gases are withdrawn at 11.

Figure 5:
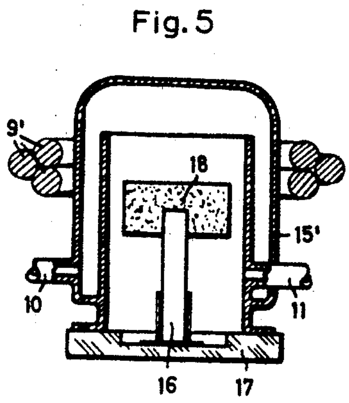
FIG. 5 illustrates, also in vertical section, a different embodiment of such processing equipment.

The embodiment of processing equipment shown in FIG. 5 is suitable for higher temperatures and hence is applicable, for example, to silicon. A graphite body 18 inductively heated by means of the high-frequency coil 9' is mounted on a vertical rod 16 consisting of $Si_3N_4$, BN or $Al_2O_3$ and is coated with a gastight layer of silicon carbide. A base 17 for supporting the quartz vessel 15' likewise consists of quartz. The assemblies to be processed are placed upon the carbide-coated heater 18 in the same manner as described above with reference to FIG. 4.

The following are examples of gaseous compositions or systems suitable as transport media in processes carried out according to the invention.

For producing an epitaxial layer of silicon on semiconductor bodies, the reaction vessel (FIGS. 5) is supplied with a gaseous mixture consisting of 10 vol. percent $SiCl_4$ and 90 vol. percent argon; and the support 2 of silicon (FIG. 3) is heated to 1200° C. The silicon transport to the bottom side of the semiconductor body, which consists for example likewise of silicon, takes place in accordance with the equation $$(1)\quad Si + SiCl_4 \underset{\text{low temperature}}{\overset{\text{high temperature}}{\rightleftarrows}} 2SiCl_2$$

That is, the transport takes place by means of the silicon subchloride which, at the localities of lower temperature and hence at the bottom side of the semiconductor body 1, is reconverted to $SiCl_4$ with accompanying segregation of elemental silicon. A precipitation period of approximately five minutes is required for epitaxially growing a layer of $10\mu$ thickness.

For growing an epitaxial layer of gallium arsenide on the semiconductor body 1, the reaction vessel (FIG. 4) is supplied with a gas mixture consisting of 10 vol. percent $I_2$ and 90 vol. percent argon; and the support consisting of GaAs is heated to 800° C. The semiconductor body 1 consists of gallium arsenide but may also consist of germanium. A transport reaction takes place according to the equation $$(2)\quad GaAs + \tfrac{1}{2}I_2 \underset{\text{low temperature}}{\overset{\text{high temperature}}{\rightleftarrows}} GaI + \tfrac{1}{4}As_4$$

Accordingly, gallium arsenide is transported by means of gallium subiodide and arsenic vapor. For producing an epitaxial layer of $10\mu$ thickness, a precipitation period of approximately 5 minutes is needed.

For growing an epitaxial layer of zinc sulfide upon a semiconductor body which also consists of zinc sulfide or silicon, a gaseous mixture consisting of 15 vol. percent $I_2$ and 85 vol. percent argon is passed into the reaction vessel (FIG. 4). The support is heated to a temperature of 1000° C. The transport from the zinc sulfide support to the bottom side of the semiconductor body takes place in accordance with the equation $$(3)\quad ZnS + \tfrac{1}{2}I_2 \underset{\text{low temperature}}{\overset{\text{high temperature}}{\rightleftarrows}} ZnI = \tfrac{1}{4}S_4$$

A precipitation period of about 10 minutes results in an epitaxial layer of $15\mu$ thickness.

When employing the method of the invention for providing semiconductor plates with epitaxial layers of $A^{III}B^{V}$ or $A^{II}B^{VI}$ or similar semiconducting compounds, it is of advantage if the temperature in the reaction vessel is nowhere lower than the condensation temperature of the nonmetal (nonmetalloid) or halogenide being liberated in the transport reaction. In order best to achieve this condition, the reaction vessel can be surrounded with a reflector of aluminum which serves to keep the quartz walls sufficiently hot by heat radiation to prevent the nonmetal of the gaseous compound from condensing at the vessel walls.

In general, the transport reaction for precipitation of the epitaxial layers described in the foregoing, should be preceded by annealing the semiconductor body and the support in vacuum or in $H_2$ atmosphere for the purpose of cleaning the surfaces that are exposed in the reaction space.

To those skilled in the art it will be obvious upon a study of this disclosure, that my invention is not limited to the particular arrangements, equipment and materials illustrated and described herein, and hence can be given various other embodiments, without departing from the essential features of my invention.

I claim:

1. Method of producing a semiconductor member by precipitating layers of a substance consisting of high-ohmic p-conductive silicon on a monocrystalline carrier of high-doped silicon, which comprises placing a surface of the carrier in contact engagement with a supporting surface of a heated support consisting of the high-ohmic p-conductive silicon as well as impurity substances whereby the carrier is heatable by heat transfer from the heated support, subjecting the supporting surface of the support to a flowing gas atmosphere containing at least one gaseous substance selected from the group consisting of halogens and halides free of hydrogen and hydrogen halide gases, and heating the support to a temperature at which a transport reaction occurs for causing transfer from the support to the carrier surface of only the high-ohmic p-conductive silicon free of said impurity substances, by forming a gaseous compound of the atmosphere with only the high-ohmic p-conductive silicon and then decomposing the gaseous compound and precipitating the high-ohmic p-conductive silicon in monocrystalline form on the surface of the carrier, a second surface of the support facing away from the surface of the carrier being provided with a coating for preventing undesired precipitation on the second surface of the support.

2. Method according to claim 1, wherein the coating comprises a gastight layer of silicon carbide.

3. Method according to claim 1, wherein the coating comprises a gastight layer of silicon dioxide.

References Cited

UNITED STATES PATENTS

| | | | |
|---|---|---|---|
| 3,096,209 | 7/1963 | Ingham | 148—175 |
| 3,099,579 | 7/1963 | Spitzer | 148—175 |
| 3,140,965 | 7/1964 | Rueschel | 148—175 |
| 3,142,596 | 7/1964 | Theuerer | 148—175 |
| 3,156,591 | 11/1964 | Hale et al. | 148—175 |
| 3,172,792 | 3/1965 | Handelman | 148—175 |

OTHER REFERENCES

Metallurgy of Semiconductor Materials, Interscience Publishers, Aug. 30–Sept. 1, 1961, publication for the AIME, vol. 15, pp. 76–80.

Tung: Metallurgy of Semiconductor Materials, vol. 15, Interscience Publishers, Aug. 30–Sept. 1, 1961, pp. 87–102, in particular page 94.

L. DEWAYNE RUTLEDGE, *Primary Examiner.*

P. WEINSTEIN, *Assistant Examiner.*

U.S. Cl. X.R.

23—223.5; 117—106, 200, 201; 148—175